United States Patent
Lohmeier et al.

(10) Patent No.: US 11,956,901 B2
(45) Date of Patent: Apr. 9, 2024

(54) MODULAR-DESIGN COMPONENT HANDLING DEVICE WITH COMPONENT GRIPPING TOOLS PROTRUDING FROM A ROTATION AXIS

(71) Applicant: ASMPT GmbH & Co. KG, Munich (DE)

(72) Inventors: Sebastian Lohmeier, Munich (DE); Thomas Rossmann, Utting (DE); Michele Trigiani, Munich (DE)

(73) Assignee: ASMPT GMBH & CO. KG (DE)

( * ) Notice: Subject to any disclaimer, the term of this patent is extended or adjusted under 35 U.S.C. 154(b) by 877 days.

(21) Appl. No.: 16/161,929

(22) Filed: Oct. 16, 2018

(65) Prior Publication Data

US 2019/0124803 A1  Apr. 25, 2019

(30) Foreign Application Priority Data

Oct. 20, 2017  (DE) .................... 10 2017 124 571.5

(51) Int. Cl.
*H05K 13/04* (2006.01)
*H05K 13/00* (2006.01)

(52) U.S. Cl.
CPC ..... *H05K 13/0404* (2013.01); *H05K 13/0015* (2013.01); *H05K 13/041* (2018.08); *H05K 13/046* (2013.01); *H05K 13/0409* (2018.08); *Y10T 29/53174* (2015.01); *Y10T 29/53178* (2015.01)

(58) Field of Classification Search
CPC ........... H05K 13/0015; H05K 13/0404; H05K 13/041; H05K 13/046; H05K 13/0408; H05K 13/0409; H05K 13/0815; Y10T 29/53174; Y10T 29/53178
See application file for complete search history.

(56) References Cited

U.S. PATENT DOCUMENTS

| 5,234,304 A | * | 8/1993 | Okumoto ............. H05K 13/041 |
| | | | 414/223.01 |
| 6,195,165 B1 | * | 2/2001 | Sayegh ............. H05K 13/0815 |
| | | | 356/400 |
| 2003/0000076 A1 | | 1/2003 | Huber et al. .................... 29/739 |

(Continued)

FOREIGN PATENT DOCUMENTS

| CN | 103118525 A | 5/2013 |
| DE | 103 02 802 A1 | 8/2004 |

(Continued)

*Primary Examiner* — A. Dexter Tugbang
(74) *Attorney, Agent, or Firm* — OSTROLENK FABER LLP

(57) ABSTRACT

A holding and drive device including a frame; a rotation structure which is attached to the frame in such a manner that it can rotate around a rotation axis; a rotation drive for rotating the rotation structure around the rotation axis; and a rotation structure interface attached to or formed on the rotation structure, to which a tool device including a plurality of sleeves can be detachably attached, which are configured for the detachable attachment of a respective component holding device protruding from the rotation axis with a radial direction component or of another tool element. A corresponding tool device, a corresponding supplementary tool device, and a component handling device constructed from these components.

8 Claims, 1 Drawing Sheet

(56) References Cited

U.S. PATENT DOCUMENTS

| | | | |
|---|---|---|---|
| 2010/0229380 A1* | 9/2010 | Endo | H05K 13/0409 29/760 |
| 2011/0094074 A1* | 4/2011 | Lo | H05K 13/0409 29/25.01 |
| 2015/0237773 A1* | 8/2015 | Nishiyama | H05K 13/0404 29/743 |
| 2016/0219761 A1 | 7/2016 | Nishiyama | 29/739 |
| 2016/0318717 A1 | 11/2016 | Chang | 414/416.03 |
| 2016/0353622 A1 | 12/2016 | Zheng et al. | 29/762 |
| 2017/0068833 A1 | 3/2017 | Bolotin et al. | 340/10.51 |

FOREIGN PATENT DOCUMENTS

| | | | | |
|---|---|---|---|---|
| DE | 10 2012 009 439 A1 | | 11/2013 | |
| DE | 10 2016 117 815 A1 | | 3/2018 | |
| EP | 1 470 747 B1 | | 5/2014 | |
| EP | 2 892 312 A1 | | 7/2015 | |
| JP | 2005-517289 A | | 6/2005 | |
| JP | 2005-302919 A | | 10/2005 | |
| JP | 2008-258359 A | | 10/2008 | |
| JP | 2009-298389 A | | 12/2009 | |
| JP | 2016092427 A | * | 5/2016 | |
| JP | 2021079505 A | * | 5/2021 | .......... B25J 15/0057 |
| TW | 445574 B | | 7/2001 | |
| TW | 2004/09727 A | | 6/2004 | |
| TW | 201623127 A | | 7/2016 | |
| WO | WO 03/065783 A1 | | 8/2003 | |
| WO | WO 2004/066700 A1 | | 8/2004 | |
| WO | WO 2013/016726 A1 | | 1/2013 | |

\* cited by examiner ns or unhoused electronic components designed as chips,
MODULAR-DESIGN COMPONENT HANDLING DEVICE WITH COMPONENT GRIPPING TOOLS PROTRUDING FROM A ROTATION AXIS

CROSS-REFERENCE TO RELATED APPLICATION

The present application claims priority to German Patent Application No. 10 2017 124 571.5, filed Oct. 20, 2017, the content of which is incorporated herein by reference.

TECHNICAL FIELD

The present invention relates in general to the technical field of equipping component carriers with electronic components. The components can be housed electronic components or unhoused electronic components designed as chips, which are removed directly from a finished processed wafer and supplied to a placement process. The present invention relates in particular to a component handling device, to the components of same and to a method for configuring such a component handling device.

BACKGROUND OF THE INVENTION

The production of electronic subassemblies occurs typically with so-called placement machines, by which electronic components are removed from a component supply device in an automated ma and placed on a component carrier such as, for example, a printed circuit board. A transfer of components from the component supply device to their respective placement position occurs by means of a component handling device, for example, a so-called placement head. In most cases, such a transfer of a component occurs by means of a single handling device, commonly referred to as placement head. However, it is also possible to transfer a component from the supply device to its placement position using two or more component handling devices. Such a handling for unhoused components designed as chips is known from EP 1 470 747 B1 for example.

In the field of electronics production, components of completely different constitution in term so dimensions/geometry, substrate material, surfaces, etc., are needed for a certain end product, i.e., for an electronic subassembly constructed on a component carrier, with typically a plurality of mutually connected electronic components. Therefore for a reliable placement, individually adapted handling operations and thus differently designed tools for the handling are necessary. For example, unhoused components designed as chips or wafer-shaped components typically having particularly small dimensions are generally picked up with different pipettes from those used for housed components. Wafer-shaped components having particularly sensitive surface structures, as in the case of MEMS components, for example, can require an individual handling with gripping tools designed specifically for such components, such as, in particular, (suction) pipettes. Thus, there is a need for component handling devices which can be adapted flexibly to different products to be manufactured.

From EP 2 892 312 A1, a placement head for a placement machine is known. The placement head comprises a carrier which is rotatable around a rotation axis and to which different head modules can be attached. The head modules comprise a plurality of pipettes which can be displaced along their longitudinal axis for the reception of a component from a component supply device and for the placing of a component received beforehand onto a component carrier, wherein this longitudinal axis is oriented parallel to the rotation axis. Different head modules differ in particular with regard to the number of pipettes. A (component specific) adaptation of the placement head requires an exchange of the head module.

The underlying aim of the invention is to improve the handling of electronic components with tools which comprise component receiving devices protruding from a rotation axis, to the effect that the handling can occur by means of an application-specific suitably configured handling device.

SUMMARY OF THE INVENTION

The aim is achieved by the subject matter of the independent claims. Advantageous embodiments of the present invention are described in the dependent claims.

According to a first aspect of the invention; a holding and drive device is described, which comprises (a) a frame; (b) a rotation structure which is attached to the frame in such a manner that it can rotate around a rotation axis; (c) a rotation drive fir rotating the rotation structure around the rotation, axis; and (d) a rotation structure interface attached to or formed on the rotation structure, to which a tool device comprising a plurality of sleeves can be detachably attached, which are configured for the detachable attachment of a respective component holding device protruding from the rotation axis with a radial direction component or of another tool element.

The holding and drive device described is based on the finding that, together with the mentioned tool device, a modular-design device for the handling of electronic components can be implemented, which can be used in context of equipping component carriers with electronic components. Such a device is also referred to as component handling device in this document. The modular-design component handling device can then be adapted in a suitable manner to the respective placement task, in particular to the type of electronic components to be mounted (housed or unhoused) which are used for the construction of an electronic subassembly. However, such a component handling device can be used not only in the context of surface placement (surface mount technology) of printed circuit boards in a placement machine, a supply device, etc.; but an additional application field is, for example, the placement of wafer-shaped components on submodules (advanced packaging). Here, submodules can be so-called SIP (System-in-Package), so-called WLFO (Wafer Level Fan Out) devices or so-called Embedded PCB devices.

It is pointed out that the holding and drive device described is a part of the mentioned component handling device and is used not for the holding and/or driving of same but for the holding and/or driving of the attachable tool device.

The frame can be any three-dimensional physical structure used as stationary base of the holding and drive device. Naturally, the expression stationary in this context refers only to the holding, and drive device and not to the coordinate system of a placement machine or of a component supply device, which can comprise a gantry system, by means of which the holding and drive device and thus the entire component handling device can be positioned freely within a predetermined movement area. The rotatability of the attached rotation structure can be implemented by suitable bearing elements which are attached to or formed on the frame and/or the rotation structure.

The rotation structure interface can be complementary to a carrier structure interface of the tool device, described below. Via the two interfaces, in preferred embodiments, information such as, for example, sensor data, control commands, etc., and/or operating resources such as, for example, an air stream, can be transferred, by means of which a low pressure is generated or transferred in suction channels into the component holding devices protruding radially or with a radial direction component. A low pressure can ensure in a known manner a temporary holding of a respective electronic component on a component holding device. In this context, operating resources can also be understood to mean electrical energy which is optionally made available to the tool device, for example, for the operation of one or more actuators for the rotation and/or radial displacement of the individual sleeves.

Depending on the respective application, the tool device can have, for example, two, four, eight or 16 sleeves. The modularity of the component handling device can be exploited in particular in that, for a holding and drive device, several different tool devices each with a different number of sleeves are provided and, independently of the respective application, the tool device is used with an appropriate number of sleeves, in order to form the most suitable component handling device.

A tool element' detachably attached to a sleeve can be held ready so that it can be provided or transferred at the give time to another functional unit (of a placement machine or of a component supply device). With the exception of suction pipettes which are subject to wear, tool elements, for example, ejector tools for ejecting chips from a wafer, an be as described in EP 1 470 747 B1, for example. If a tool element is held ready on a sleeve, then this sleeve can also be referred to as tool storage (place).

The expression "with a radial direction component" is understood to mean all the directions (from a longitudinal axis) of the component holding device or of another tool element that are not parallel to the rotation axis. Thus, in particularly preferred exemplary embodiments, the sleeves and/or the component holding devices or other tool elements detachably attached thereto protrude radially from the rotation axis. However, it is also possible that the longitudinal axes of the holding devices or other tool elements lie within a plane perpendicular to the rotation axis and have an offset relative to the rotation axis. Furthermore, it is possible that the longitudinal axes of the holding devices or other tool elements also have a direction component parallel to the rotation axis. In these case, the (extensions of the) longitudinal axes can intersect the rotation axis or have a spatial offset relative to the rotation axis.

According to an exemplary embodiment of the invention, the holding and drive device moreover comprises a displacement drive which is attached to the frame or to the rotation drive and which is configured so as to displace the rotation structure. The displacement can occur in particular along or parallel to the rotation axis. Here, in a simple way, a tool plane, which is defined by certain tool reference points, for example, the centre points of the tips of component holding devices (for example, the so-called pipette tips) of the rotatable tool, can be displaced in such a way that components located in certain positions can be picked up by the tool or components that have been picked up can be deposited in certain positions (for example, positions of placement on or transfer to another tool device). The tool plane can be determined either from the ideal or from the actual positions of the tool reference points determined by measurement.

Furthermore, due to the displacement drive it is also possible to compensate for existing position tolerances between the attached tool device and another functional device, so that a highly accurate and above all reliable handling of electronic components can be ensured.

Naturally, during the activation of the displacement drive, a displacement of the component holding device of the tool device occurs only if the tool device is in fact attached to the rotation structure.

According to an additional exemplary embodiment of the invention, the rotation structure interface is set up to transfer energy and/or data between the holding and drive device and the tool The energy transfer between (i) the holding and drive device and (ii) the tool device and in particular from (i) the holding and drive device to (ii) the tool device can occur with different types of energies. For example, the energy can be mechanical energy. Here, due to the movement of a primary element of the holding and drive device, a secondary element of the tool device can be driven. Such a secondary element can be associated, for example, with an actuator for the rotation and/or radial displacement of the individual sleeves. Electrical energy transferred via the rotation structure interface can be used for an actuation of a corresponding electrical actuator. Pneumatic energy transferred via the rotation structure interface can in a known manner be used for the generation or transfer of lover pressure for a suction pipette, in order to pick up an electronic component.

Data can be transferred (preferably bidirectionally) between (i) the holding and drive device and (ii) the tool device. In this way, the configuration of an entire component handling device can be determined in a simple manner and transferred to a control device for the entire component handling device via a suitable additional interface of the holding and drive device.

According to an additional exemplary embodiment of the invention, the rotation structure interface is configured for the accurately repeatable positioning and/or fixing of the tool device on the holding and drive device.

Suitable means for the accurately repeatable positioning and/or fixing of the tool device can contribute towards the result that, after an assembly of the component handling device, the component handling device is always in a predetermined and desired spatial configuration. These means can be implemented, for example, by a suitable spatial or physical design of the two participating interfaces, namely the rotation structure interface and the carrier structure interface.

The two interfaces can be designed in such a way that they can be detached from one another by an operator easily (i.e., manually), with a tool or optionally also without a tool. An assembly of the component handling device can also be carried out in a corresponding manner by an operator.

Alternatively, at least one of the two interfaces can be actuated automatically by a control component in particular of the component supply device in question or of the placement machine in question. Such an automatic actuation can occur, for example, by means of a pneumatic or electric drive.

In order to simplify the handling (for time reasons and/or due to possibly present poor spatial accessibility), at least one of the two (mechanical) interfaces can advantageously be designed as a rapidly detachable connector. Suitable for this are, in particular, quick-release locking screws, bayonet closures, snap-in connections, clip connections, etc.

It is pointed out that the above-described features and/or advantages of the carrier structure interface also apply to all the other interfaces described below in connection with other components of the component handling device.

According to an additional exemplary embodiment of the invention, the holding and drive device moreover comprises a control unit for controlling the rotation drive and/or for controlling other optionally present drives and/or actuators of the holding and drive device or of the tool device.

The described control unit has the advantage that the component handling device can be considered a self-sufficient system, in particular within a component supply device or a placement machine, so that the operation thereof only has to be coordinated via a higher-level control device. Here such coordination must occur in relation to other functional units, in particular in relation to a component supply device or a placement machine. The functionality of the described control unit can also be implemented by a control device originally intended to actuate a system higher level with respect to the component handling device.

The additional drives or actuators can be, for example, (i) individual motors or a common motor for a rotation of the sleeves about their respective longitudinal axis, individual linear motors and/or (ii) a common linear motor for a displacement of the sleeves along their respective longitudinal axis and/or actuators for the switching of pneumatics in connection with a low pressure necessary for picking up electronic components.

According to an additional exemplary embodiment of the invention, the holding and drive device moreover comprises a reading unit for the detection of an identification element of the tool device. This has the advantage that, during assembly of the component handling device, the respective tool device attached to the holding and drive device can be detected automatically. In this way, the accurate configuration of the entire component handling device can be identified in a simple and automated manner. Thereby, the operational reliability of the component handling device in cooperation with a placement machine and/or a component supply device can be increased in an effective manner.

The precise formation of the reading unit depends in particular on the type of the identification element. A possible identification element is, for example, a barcode, a matrix code, or a RFID tag.

According to another aspect of the invention, a tool device is described, which comprise (a) a carrier structure: (b) a plurality of sleeves which are attached to the support structure in such a way that they protrude from a central axis of the carrier structure with a radial direction component, wherein the sleeves in each case have an end which is distant from the central axis, and on which a component handling device for receiving in each case an electronic component or a toll element can be attached; and (c) a carrier structure interface attached to or formed on the carrier structure, which is configured in such a way that the tool device can be detachably attached to a holding and drive device.

The described tool device is based on the finding that, together with the mentioned holding and drive device, a modular-design device for the handling of electronic components can be implemented, which can be used in the context of equipping component carriers with electronic components. Advantages and features of such a modular-design component handling device have already been explained above or are explained below and therefore not presented here.

However, additionally, reference is made here to the fact that a (temporary removal and/or disassembly of the tool device can also have the advantage that the tool device can be removed from an area of a placement machine, of a component supply device, etc., which is poorly accessible to an operator. Due to the removal to a spatial area with improved accessibility, it becomes possible for the operator is equip the tool device for a certain manufacturing order in an ergonomically advantageous manner outside of the machine in question with the necessary tool elements such as, for example, suction pipettes.

Furthermore, it is pointed out that, in the operation of the tool device with at least one component holding device, which is (detachably) attached to a sleeve, this component holding device also extends radially or with a radial direction component away from the central axis. In this consideration, a longitudinal axis of the component holding device is crucial.

The mentioned central axis can be a symmetry axis for a substantially annular shape of the carrier structure. In the assembled state of the component handling device, the central axis can coincide with the rotation axis of the holding and drive device.

Here too, the expression "with a radial direction component" can refer to all the directions (from a longitudinal axis) of the component holding device or of another tool element, which are not parallel to the rotation axis. Examples for further specification of this expression are explained above and are not indicated again here.

According to an exemplary embodiment of the invention, the tool device moreover comprises an additional carrier structure interface which is configured in such a way that an additional tool device can be attached to the carrier structure. This has the advantage that a component handling device with increased productivity can be assembled. In addition, by providing several different additional tool devices, the flexibility with regard to a configuration of the component handling device, which is particularly suitable for a respective application, can be further improved. The additional tool device is also referred to as supplementary tool device below in this document.

The additional carrier structure interface is preferably attached to or formed on a side of the carrier structure, which is opposite respect to the carrier structure interface.

As already described above, the construction of the additional carrier structure interface can be identical to the rotation structure interface. This has the advantage that the additional tool device can also be attached directly to the holding and drive device, without the tool device. As a result, the flexibility with regard to an application-specific configuration of the component handling device is further increased. Naturally, if it is technically/economically advantageous, the additional carrier structure interface can also be different from the rotation structure interface.

Preferably, the additional carrier structure interface is formed so that it is independent of the rotation structure interface and no interferences/collisions between these two interfaces occur.

Different (rotation structure and additional, carrier structure) interfaces can be appropriate, for example, if one does not want to provide a relatively complex (automatic) quick-release mechanism of the rotation structure interface on each tool device as an additional carrier structure interface. For example; it is possible, to connect the tool device with screw connections to at least one additional tool device or supplementary tool device during a pre-placement (i.e., at a work place outside of a machine), while only the rotation structure interface is designed as an automatic quick-release device.

In preferred embodiments, the additional carrier structure interface can jointly use at least a part of the first interface. Parts that are suitable for joint use can be, for example, parts for an energy supply and/or a data transfer.

According to an additional exemplary embodiment of the invention, the additional carrier structure interface is configured for the accurately repeatable positioning and/or fixing of the additional tool devices on the tool device.

The carrier structure interface and/or the additional carrier structure interface can be constructed, optionally in a complementary manner, like the above-described rotation structure interface. This results, for the carrier structure interface and/or the additional carrier structure interface, in the same above-described development possibilities and/or advantages as for the rotation structure interface.

According to an additional exemplary embodiment of the invention, the sleeves are arranged in one tool plane, in two tool planes or in three or more tool planes. Here, as already presented above, a tool plane can be defined in particular by the radially outer ends of the sleeves or of the pipette tips, which are associated with the tool plane in question. A tool plane can be determined either from the ideal positions or from the actual positions (determined by a measurement) of the tool reference points, in particular of the outer ends of the sleeves or of the pipette tips.

Preferably at least two sleeves are arranged in each plane along the circumference of the carrier structure symmetrically, i.e., with equal (angular) spacings with respect to one another. A tool plane can be displaced so that components located in certain positions are picked up by the tool, or components that have been picked up are delivered to certain positions (for example, fitting positions of placement on or transfer to another tool device).

According to an additional exemplary embodiment of the invention, the sleeves configured for receiving tool elements.

Descriptively expressed, the (ends of the) sleeves are set up in order to provide tool elements for other functional units of the placement machines, of the supply device, etc. In this case, a sleeve can also be referred to as a tool storage (place), where a respective tool element can be held ready for another functional unit.

The tool elements be held ready in order to be automatically exchanged for other tool elements after wear or after the switch to the handling of another component. Thus, advantageous other functional units can also benefit from improved flexibility of the component handling tool.

The tool elements can be, for example, pipettes for the placement head of a placement machine, pipettes for a removal tool and/or a reversal tool of a chip removal device (compare with the above-mentioned EP 1 470 747 B1). In addition, the tool elements can be ejector tools for the ejection of unhoused semi-conductor chips from a compound wafer structure.

According to an additional exemplary embodiment of the invention, the tool device moreover comprises an identification element which is attached in particular to the carrier structure. This allows a holding and drive device with a suitable (above-described) reading device to perform an automatic detection of the type of the tool device will be attached or is attached to the holding and drive device.

According to another aspect of the invention, a supplementary tool device is provided, which comprises (a) a supplementary carrier structure; (b) a plurality of supplementary sleeves which are attached to the supplementary carrier structure in such a manner that they protrude from a supplementary central axis of the supplementary carrier structure with a radial direction component, wherein the supplementary sleeves in each case have end distant from the supplementary central axis, on which a supplementary component holding device for the receiving of in each case an electronic component or a tool element can be attached; and (e) a supplementary carrier structure interface attached to or formed on the supplementary carrier structure, which is configured in such a way that the supplementary tool device can be detachably attached to a tool device, in particular to an above-described tool device.

The described supplementary tool device is based on the finding that the above-mentioned tool device and thus also the component handling device can be expanded to the effect that an additional number of sleeves for the receiving of additional component receiving devices are provided, which increase the capacity or the productivity. In preferred embodiments, the tool device is used for the handling of electronic components, and the supplementary tool device is used for the receiving of tool elements, for example, of other component receiving devices, which, as needed, are transferred (indirectly via an intermediate tool) to the tool device or to another tool device which works together with the supplementary tool device in a transfer position. The additional tool device can be, for example, a rotatable removal tool of a chip removal device which is described in EP 1 470 747 B1. Naturally, conversely, the tool device can also be used for the temporary receiving of tool elements and the supplementary tool device can be used for the receiving of electronic components.

The supplementary tool device can be constructed like or similar to the tool device and have the same advantages. Only the described supplementary carrier structure interface is not necessarily complementary or matching with respect to the rotation structure interface but rather is so with respect to the carrier structure interface. Via the supplementary carrier structure interface (and also via the carrier tare interface) it is optionally possible to transfer operating resources, in particular the above-mentioned operating resources, for the operation of the supplementary tool device.

The supplementary tool device can also be constructed differently from the tool device. For example, the tool devices can differ in the number of their sleeves, in the number of the tool planes in which the sleeves and thus the component holding devices are arranged, in the axial subdivision of different tool planes and/or in the type of the (radially outer) ends of the sleeves.

With regard to the meaning of the expression "with a radial direction component," which relates to the longitudinal axis of the component holding device in question, reference is made to the above explanations.

According to an additional exemplary embodiment of the invention, the supplementary tool device moreover comprises a supplementary identification element which is attached in particular to the supplementary carrier structure. The supplementary identification element, like the above-described identification element of the tool device, makes possible an automatic detection of the actual configuration of the entire component handling device.

According to an additional aspect of the invention, a device for handling electronic components is described, in particular in the context of equipping component carriers with electronic components. The described device comprises (a) an above-described holding and drive device, and (b) an above-described tool device. The holding and drive device and the tool device are coupled to one another via the rotation structure interface and the carrier structure interface.

The component handling device provided is based on the finding that, by an assembly of the above-described components, (i) holding, and drive device and (ii) tool device, and by the selection of an appropriate tool device, a configuration of the device for the handling of electronic components can be achieved, which is optimised for the respective application.

According to an additional exemplary embodiment of the invention, the device moreover comprises an above-described supplementary tool device, wherein the tool device and the supplementary tool device are connected to one another via the carrier structure interface and the supplementary carrier structure interface.

As already mentioned above, the component handling device can comprise several identical or different tool devices (including the described supple en tool device). Thereby, a modular design of the component handling device is achieved. The combination of the individual tool device modules can be assembled in an application specific manner.

During an assembly of the component handling device, the supplementary tool device can be connected first to the tool device, and thereafter the whole consisting of supplementary tool device and tool device can be coupled via the rotation structure interface to the holding and drive device. Thereby, outside of a placement machine or a component supply device, the tool devices can be equipped with pipettes in an application-specific manner by an operator. As known from conventional magazines of replacement (pipettes), these work steps can advantageously be carried out outside of the placement machine or of the component supply device.

According to an additional aspect of the invention, a method is described for the application-specific configuration of a device for the handling of electronic components. The method comprises (a) a provision of an above-described holding and drive device; (b) a provision of an above-described tool device; (c) an attachment of a respective application-specific selected component holding device or an application-specific selected tool element to one of the sleeves; and (d) an attachment of the tool device to the holding and drive device.

The described method is based on the finding that, by a tool device suitable for the respective application and/or by a suitable fitting of the tool device with component holding devices suitable for the respective application or for the components to be handled, a component handling device can be created, which, with regard to different component handling operations, can in each case have a suitable configuration and/or whose productivity is adapted to the currently present requirements. The term productivity therefore can include in particular the number of components which can be handled within a predetermined time span with component handling devices resulting from the described method.

It is pointed out that, in additional embodiments of the described method, it is also possible to use an above-described supplementary tool device, so that the component handling device can be configured even better in an application specific manner.

Furthermore, the modular design of the above-described component handling device also enables the possibility of adapting an already constructed component handling device with a view to a new application. This can occur, for example, in that (i) a tool device is replaced by another tool device, (ii) a supplementary tool device is replaced by another supplementary tool device, (iii) a supplementary tool device is added and/or (iv) a supplementary tool device is removed.

If the modules of the described modular component handling device are provided with identification elements (as described above, for example), then the exact configuration of a (just) assembled component handling device can be detected automatically. The configuration detected can be transmitted in an appropriate manner to a control unit which controls the operation of the component handling device. The functionality of such a control unit can also be provided by a control device of a higher-level system such as, for example, a placement machine or a component supplying device for a placement machine.

It is now pointed out that embodiments of the invention have been described in reference to different subject matters of the invention. In particular, some embodiments of the invention have been described with device claims and other embodiments of the invention have been described with method claims. However, upon reading this application, it will become immediately clear to the person skilled in the art that, unless explicitly indicated otherwise, in addition to a combination of features which belong to a type of inventive subject matter, any combination of features which belong to different types of inventive subject matters is also possible.

Before exemplary embodiments of the invention are described in reference to the drawing, some technical considerations in connection with the invention are presented below.

Additional advantages and features of the present invention result from the following exemplary description of currently preferred embodiments. The individual figures of the drawing of this document should only be considered to be diagrammatic and not true to scale.

DETAILED DESCRIPTION

Figure 1:
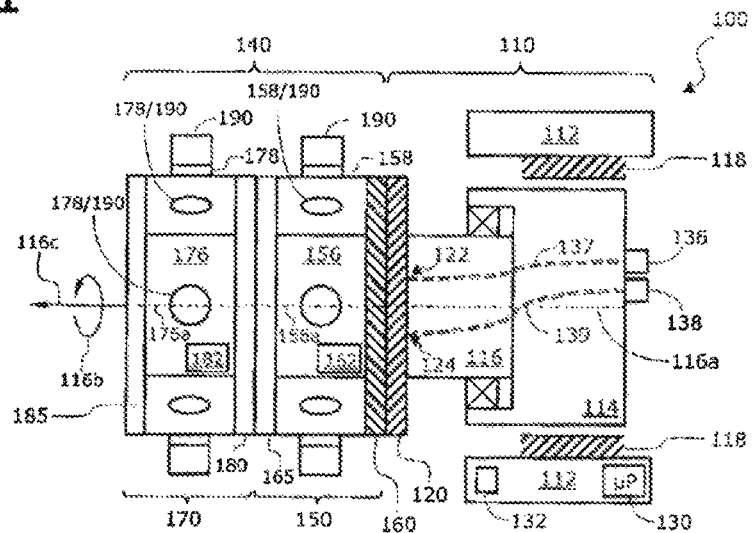
FIG. 1 shows a component handling device with a holding and drive device, a tool device attached thereto, and a supplementary tool device attached to the tool device.

It is pointed out that, in the following detailed description, features and components of different embodiments which are identical or at least functionally identical to the corresponding features and components of another embodiment are provided with the same reference numerals or reference numerals whose last two digits are identical to the reference numerals of corresponding identical or at least functionally identical features or components. In order to avoid unnecessary repetitions, features and components already explained in reference to a previously described embodiment are not explained in detail later on.

Furthermore, pointed out that the embodiments described below represent merely a limited selection of possible embodiment variants of the invention. In particular, it is possible to combine the features of individual embodiments in an appropriate manner with one another, so that for the person skilled in the art, by way of the embodiment variants explicitly represented here, a plurality of different embodiments should be considered to be obviously disclosed.

In addition, it is pointed out that space-related terms such as, for example, "front" and "rear," "top" and "bottom,"

"left" and "right," etc., are used in order to describe the relationship of an element with respect to another element or to other elements as illustrated in the figures. Accordingly, the space-related terms can apply to orientations which differ from the orientations represented in the figures. However, it should be understood as obvious that, for the sake of the simplicity of the description, all such space-related terms relate to the orientation represented in the drawings and are not necessarily limiting, since the respective represented device, component, etc., when in use, can assume orientations which can be different from the orientations represented in the drawing.

FIG. 1 shows a component handling device 100 according to an exemplary embodiment of the invention. The component handling device 100 comprises a holding and drive device 110, a tool device 150 attached thereto, and a supplementary tool device 170 attached to the tool device 150. The whole consisting of tool device 150 and supplementary tool device 170 is referred to as tool system 170 in this document.

The holding and drive device 110 has a frame 112 as basic structure. Furthermore, the holding and drive device 110 comprises a rotation structure 116, on which a rotation structure interface 120 is attached or formed. Suitable bearing elements, not described in further detail, make it possible for the rotation structure 116 to be rotated by means of a rotation drive 114 around a rotation axis 116a and displaced along the rotation axis 116a by means of a displacement drive 118 designed as linear motor. The corresponding rotation movement is illustrated in FIG. 1 on the left side with the arrow 116b. The corresponding displacement movements are illustrated by the part 116c.

The tool device 150 can be coupled to the rotation structure interface 120. For this purpose, the tool device 150 comprises a carrier structure interface 160, which is attached to or formed on a carrier structure 156 of the tool device 150. The earner structure interface 160 is complementary to the rotation structure interface 120 and enables a position-accurate attachment of the tool device 150 on the holding and drive device 110. The carrier structure 156 and the tool device 150 have a central axis 156a which coincides with the rotation axis 116a in the assembled state of the component handling device 100.

As tool elements, the tool device 150 has a plurality of component holding devices 190, wherein in each case a component holding device 190 is fit onto the radially outer end of a sleeve 158. The component holding devices 190, which are preferably so-called suction pipettes, are used in a known manner for the pneumatic picking-up of in each case an electronic component to be handled. The pneumatic picking-up here also occurs in a known way by the application of a low pressure in a suction channel of the respective suction pipette.

During operation, the tool device 150 with its suction pipettes 190 radially protruding from the central axis 156a requires operating resources such as, for example, electrical energy and/or a low pressure in the suction channels of the suction pipettes 190. These operating resources are first made available, according to the exemplary embodiment represented here, to the holding and drive device 110 via an operating resources connection 136. By the operating resource connection 136, the operating resource "(electrical) energy" and "low pressure" are made available via a suitable operating resource line 137 to an operating resource interface portion 122 of the rotation structure interface 120. A complementary interface portion of the carrier structure interface 160 is not shown for reasons pertaining to the clarity of the representation of FIG. 1.

Furthermore, according to the exemplary embodiment represented here, the holding and drive device 110 comprises a data connection 138, via which data can be transferred to an external higher-level data processing device (not represented). For example, data can be transferred via a communication connection, not represented, to and from a control unit 130 which controls the operation of the component handling device 110 based, for example, on coordinating control signals of an external higher-level data processing device. An optional data transfer between the data connection 138 and the tool device 150 can occur via a data line 139 and a data interface portion 124 of the rotation structure interface 120. An interface portion, complementary to the data interface portion 124, of the carrier structure interface 160 is again not shown for reasons pertaining to clarity in FIG. 1.

In order to identify the tool device 150 attached to the holding and drive device 110, according to the exemplary embodiment represented here, the tool device 150 comprises an identification element 162 which is automatically acquired by a reading unit 132 of the holding and drive device 110 as soon as the tool device 150 is attached. The corresponding information on the current configuration of the component handling device 100 can then be passed on via the data connection 138 to an external data processing device which uses this data for a coordination of the operation of the component handling device 100.

According to the exemplary embodiment represented here, the tool device 150 moreover comprises an additional carrier structure interface 165 which is attached to or formed on the opposite side of the carrier structure 156 with respect to the carrier structure interface 160. As can be seen from FIG. 1, this additional carrier structure interface 165 is used to make it possible for an additional tool device 170, also referred to as supplementary tool device 170 in this document, to be attached to the tool device 150. Thereby, the productivity of the component handling device 100 and/or the flexibility of the component handling device 100 with a view to different applications can be increased. This applies particularly if different types of tool devices are held ready tool device 150 and/or the supplementary tool device 170.

According to the exemplary embodiment, represented here, the supplementary tool device 170 has a very similar structure with respect to the tool device 150. Accordingly, the supplementary tool device 170 comprises a supplementary carrier structure 176 which has a supplementary central axis 176a. In the assembled state of the tool system 140 or of the component handling device 100, the supplementary central axis 176a coincides with the central axis 156a and with the rotation axis 116a. A supplementary carrier structure interface 180 which is complementary to the additional carrier structure interface 165 of the tool device 150 is attached to or formed on the supplementary carrier structure 176. Furthermore, on the supplementary carrier structure 176, an additional supplementary carrier structure interface 185 is attached or formed, via which a possible additional supplementary tool device, not show can be attached, so that, in this special case, the tool system 140 comprises a total of three tool devices.

The sleeves of the supplementary tool device 170, which are referred to as supplementary sleeves in this document, are provided with reference numeral 178 in FIG. 1. Just as the tool device 150 comprises an identification element 162, the supplementary tool device 170 in a corresponding manner and for the same purpose comprises a supplementary identification element 182.

FIGS. 2A to 2D show different embodiments of a tool device for a component handling device 170.

Figures 2A, 2B, 2C, 2D:
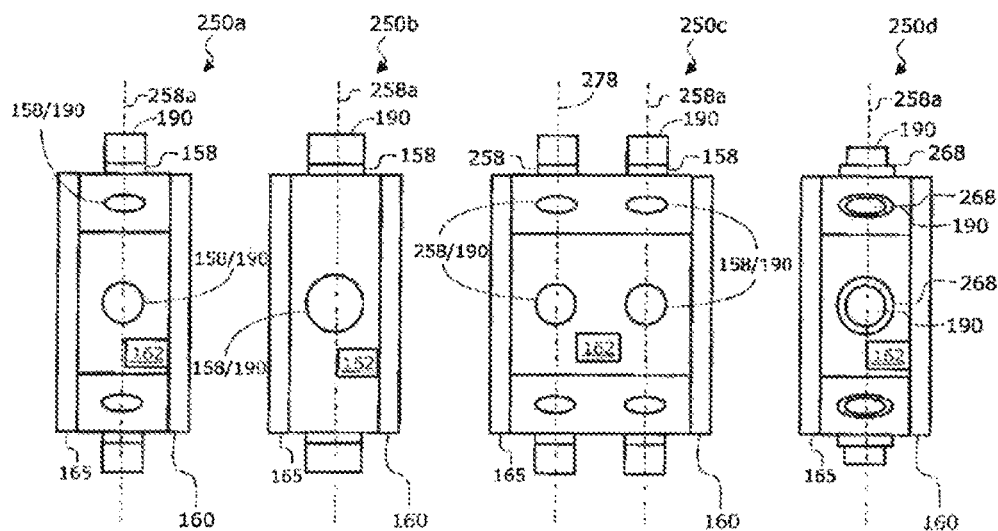
FIGS. 2A to 2D show different embodiments of a tool device for a component handling device.

The tool device 250*a* represented in FIG. 2A, which corresponds to the tool device 150 represented in FIG. 1, comprises a total of eight sleeves 158, of which only five can be seen, for perspective reasons. The (radial ends of the) sleeves 158 or the outer tips of the component holding devices 190 attached thereto, which are designed as suction pipettes, define a tool plane 258*a*. In the case of a displacement of the rotation structure 116 represented in FIG. 1 by the displacement drive 118, this tool plane 258*a* is displaced along its normal. Thereby, the tool device 250*a* can be positioned at least along one direction with respect to other functional elements of a placement machine or of a component supply device (both are not represented) or with respect to placement positions.

The tool device 250*b* represented in FIG. 2*b* differs from the tool device 250*a* only in that it has a total of four sleeves 158. Of these four sleeves, three can be seen in FIG. 2*b*.

The tool device 250*c* represented in FIG. 2*c* has two tool planes, a tool plane 258*a* and an additional tool plane 278*a*. According to the exemplary embodiment represented here, a total of eight sleeves 158 or eight additional sleeves 258 as well as a corresponding number of component holding devices 190 are associated with each tool plane 258*a*, 278*a*.

The tool device 250*d* represented in FIG. 2*d* differs from the tool device 250*a* in that the sleeves are formed in each case as a tool storage 268 on which a tool element 190, for example, a component holding device or an ejector tool for a wafer, can be held ready for other functional units. If the tool storages 268 are receiving places for component holding devices, then they are held ready in reversed orientation in comparison to the component holding devices 190 which are attached to the tool devices 250*a*, 250*b* and 250*c*. A transfer of a tool element 190 formed as component holding device from the tool device 250*d* to another functional device, in particular to another tool device, then occurs in that the tool device 250*d* and the other tool device are positioned with respect to one another in such a way that, in a common transfer position, the tool element 190 in question can be transferred to a sleeve of the other tool device. In the same way, tool elements 190 formed as ejector tools are transferred.

From the above disclosure apparent that the component handling device 100 represented in FIG. 1, due to its modular design, can be configured specifically for different applications in the electronics production by a suitable selection of the type of the tool device 150 coupled to the holding and drive device 110 and optionally by a suitable selection of the supplementary tool device 170 coupled to the tool device 150. Below, a clear description is provided of a method for the configuration of a tool system for a component handling device and of a method for the adapting of a component handling device. In addition, a method for the automatic detection of a configured tool system or of a tool device is described.

(A) A method for the configuration of a tool system can comprise the following steps:

Provision of at least one tool device as a module for the tool system or the component handling device.

Provision of the respective necessary type and number of tool elements (component holding devices, ejector tools, etc.) to be attached on (the sleeves) of the tool device.

In the case of several tool devices: assembly of the tool device and supplementary tool device modules to form complete tool system. The connection between the two modules occurs via the above described interfaces.

Attachment of the tool elements in the respective necessary type and quantity and in a predetermined sequence on the sleeves of the tool devices.

Optionally: storing of the type and quantity of the tool elements attached to the sleeves in a storage area, provided for this purpose, of the respective tool device. As needed, a local control unit or a data processing device (for example, of a placement machine) can access this storage area. Here, in addition, a reference to a coding of the tool device in question can be produced, so that the control unit or the data processing device can establish a connection with the tool device.

(B) A method for the adapting of a component handling device comprise the following steps:

Provision of an above-described holding and drive device.

Provision of a tool system as configured above under point (A).

Positioning of the rotation axis of the holding and drive device in positions provided for the tool system, by a control component of the modular component handling tool or of the placement machine.

Attachment of the tool system on the holding and drive device via the rotation structure interface and the support structure interface.

Placing of a mechanical fixation between the rotation structure interface and the carrier structure interface (initiated manually or automatically by a control component of the modular component handling device or of the placement machine).

(C) A method for automatic detection of a configured tool system or of a tool device can comprise the following steps:

A control component of the modular component handling device and/or of another functional unit (for example, of the placement machine) as higher-level control is configured automatically after a tool system has been configured.

By the automatic configuration, parameters which are necessary for the controlling of the modular component handling device, of the placement machine and/or of another functional unit can be automatically adapted. Parameters can be, example, the design of the tool system and/or calibration factors.

Optionally, information the configuration of the modular component handling device can be displayed on a use interface for an operator.

To the extent that the modular component handling device comprises a reading unit and the tool device(s) of the tool system (in each case) comprise(s) an unequivocal identification element (hereafter also referred to as module ID), an automatic identification by a control component of the component, handling device or of the placement machine can occur, after a tool system has been coupled to the holding and drive device. For this purpose, the tool devices in each case can have a module ID which contains data or an unequivocal coding for the identification. The module ID can be read optically (barcode, QR code, etc.), electronically (for example, EEPROM) of electromagnetically (RFID) and can be set up for the storage of additional data (for example, calibration data, tool fitting).

A corresponding reading unit can be integrated in the modular component handling device. Alternatively, the module IDs of the tool devices can also be acquired and evaluated with already present sensors. For example, for optical coding, an existing camera system of the placement machine can be used.

LIST OF REFERENCE NUMERALS:

100 Component handling device
110 Holding and drive device
112 Frame
114 Rotation drive
116 Rotation structure
116a Rotation axis
116b Rotation movement
116c Displacing movement
118 Displacement drive/linear motor
120 Rotation structure interface
122 Operating resources interface portion
124 Data interface portion
130 Control unit
132 Reading unit
136 Operating resources connection
137 Operating resources line
138 Data connection
139 Data line
140 Tool system
150 Tool device
156 Support structure
156a Central axis
158 Sleeves
160 Support structure interface
162 Identification element
165 Supplementary support structure interface
170 Supplementary tool device/Additional tool device
176 Supplementary support structure
176a Supplementary central axis
178 Supplementary sleeves
180 Supplementary support structure interface
182 Supplementary identification element
185 Additional supplementary support structure interface
190 Tool element/component holding device (suction pipette) or ejector tool
250a Tool device
250b Tool device
250c Tool device
250d Tool device
258a Tool plane
268 Tool storage
278a Additional tool plane

The invention claimed is:

1. A holding and drive device comprising:
a frame;
a rotation structure which is attached to the frame in such a manner that the rotation structure can rotate around a rotation axis;
a rotation drive for rotating the rotation structure around the rotation axis; and
a rotation structure interface attached to or formed on the rotation structure, to which a tool device can be detachably attached such that in use the tool device rotates around the rotation axis driven by the rotation drive, the tool device having a central axis that coincides with the rotation axis and comprising a plurality of sleeves circumferentially arranged about the rotation axis, which are configured for the detachable attachment of a respective component holding device protruding orthogonally from the rotation axis with a radial direction component or of another tool element,
wherein the rotation structure interface is set up to transfer data or energy between the holding and drive device and the tool device, the energy comprising directly transferred electrical energy for an electrical actuator for rotation or radial displacement of a sleeve of the plurality of sleeves, or pneumatic energy, and
a displacement drive which is attached to the frame or to the rotation drive and which is configured to displace the rotation structure along and parallel to the rotation axis.

2. The holding and drive device of claim 1, wherein the rotation structure interface is configured for accurately repeatable positioning and/or fixing of the tool device on the holding and drive device.

3. The holding and drive device of claim 1, further comprising:
a control unit.

4. The holding and drive device of claim 3, wherein the control unit is for controlling the rotation drive.

5. The holding and drive device of claim 3, wherein the control unit is for controlling actuators of the holding and drive device or of the tool device.

6. The holding and drive device of claim 1, further comprising:
a reading unit for detection of an identification element of the tool device.

7. A device for handling electronic components, for equipping component carriers with electronic components, the device comprising:
a holding and drive device according to claim 1, and
the tool device, the tool device comprising:
a support structure;
the plurality of sleeves which are attached to the support structure so that they protrude from a central axis of the support structure with a radial direction component, wherein the sleeves each comprise an end distant from the central axis of the support structure, on which end a component holding device for receiving a respective electronic component or a respective tool element can be attached; and
a support structure interface attached to or formed on the support structure, which is configured so that the tool device can be detachably attached to the holding and drive device,
wherein
the holding and drive device and the tool device are coupled to one another via the rotation structure interface and the support structure interface.

8. The device according to claim 7, comprising:
the tool device;
a supplementary tool device for the tool device having a supplementary tool support structure comprising:
a supplementary support structure;
a plurality of supplementary sleeves which are attached to the supplementary support structure so that they protrude from a supplementary central axis of the supplementary support structure with a radial direction component, wherein
the supplementary sleeves in each case have an end distant from the supplementary central axis, on which end a supplementary component holding device can be attached for receiving in each case a respective electronic component or a respective tool element, and
a supplementary support structure interface attached to or formed on the supplementary support structure, which is configured so that the supplementary tool device can be detachably attached to the tool device, wherein
the tool device further comprises:
an additional support structure interface which is configured so that an additional tool device can be attached to the support structure, and wherein
the tool device and the supplementary tool device are connected to one another via the additional support structure interface and the supplementary support structure interface.

* * * * *